(12) United States Patent
Schuler-Watkins et al.

(10) Patent No.: US 11,390,519 B2
(45) Date of Patent: Jul. 19, 2022

(54) METHOD FOR MANUFACTURING A MEMS SENSOR

(71) Applicant: Robert Bosch GmbH, Stuttgart (DE)

(72) Inventors: Sebastian Schuler-Watkins, Herrenberg (DE); Daniel Haug, Neuffen (DE); Tobias Henn, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/267,720

(22) PCT Filed: Sep. 20, 2019

(86) PCT No.: PCT/EP2019/075281
§ 371 (c)(1),
(2) Date: Feb. 10, 2021

(87) PCT Pub. No.: WO2020/064525
PCT Pub. Date: Apr. 2, 2020

(65) Prior Publication Data
US 2021/0309512 A1   Oct. 7, 2021

(30) Foreign Application Priority Data

Sep. 25, 2018   (DE) .......................... 102018216282.4

(51) Int. Cl.
*H01L 21/00*   (2006.01)
*B81C 1/00*   (2006.01)
*B81C 3/00*   (2006.01)
*G01L 19/00*   (2006.01)

(52) U.S. Cl.
CPC .......... *B81C 1/00301* (2013.01); *B81C 3/001* (2013.01); *G01L 19/0069* (2013.01); *B81B 2201/0264* (2013.01); *B81C 2203/037* (2013.01)

(58) Field of Classification Search
CPC ................ B81C 1/00301; B81C 3/001; B81C 2203/037; G01L 19/0069; B81B 2201/0264
See application file for complete search history.

(56) References Cited

U.S. PATENT DOCUMENTS

| | | |
|---|---|---|
| 2005/0046021 A1 | 3/2005 | Hosokawa |
| 2017/0176278 A1 | 6/2017 | Chen et al. |
| 2018/0016133 A1 | 1/2018 | Cadag et al. |
| 2018/0313709 A1* | 11/2018 | Chiou ................... G01L 9/0073 |

FOREIGN PATENT DOCUMENTS

DE   102016220077 A1   4/2018

OTHER PUBLICATIONS

Smith, Lee: "Leadless lead frame packaging for automotive and high-density requirements", UTAC Thailand EDA365, (2019), pp. 1-11, https://www.utacgroup.com.
International Search Report for PCT/EP2019/075281, dated Dec. 18, 2019.

\* cited by examiner

*Primary Examiner* — Samuel A Gebremariam
(74) *Attorney, Agent, or Firm* — Norton Rose Fulbright US LLP; Gerard Messina

(57) ABSTRACT

A method for manufacturing a MEMS sensor. The method includes: providing a substrate, applying a support layer onto a back side of the substrate, forming at least one cavity in the substrate in such a way that an access to the back side from the front side is formed, introducing a MEMS structure into the at least one cavity, and fixing the MEMS structure on the support layer.

12 Claims, 7 Drawing Sheets

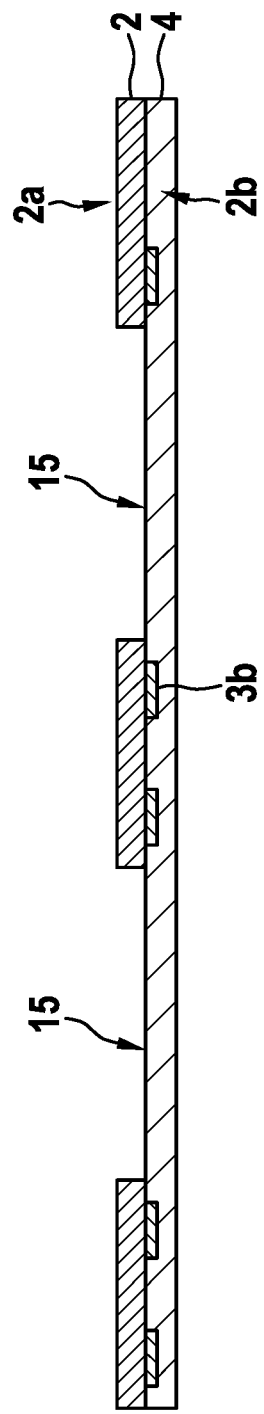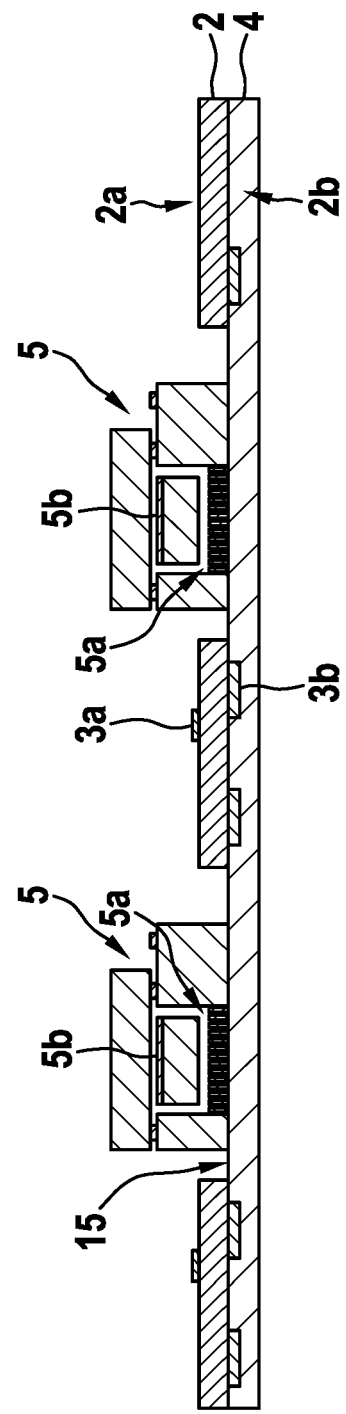

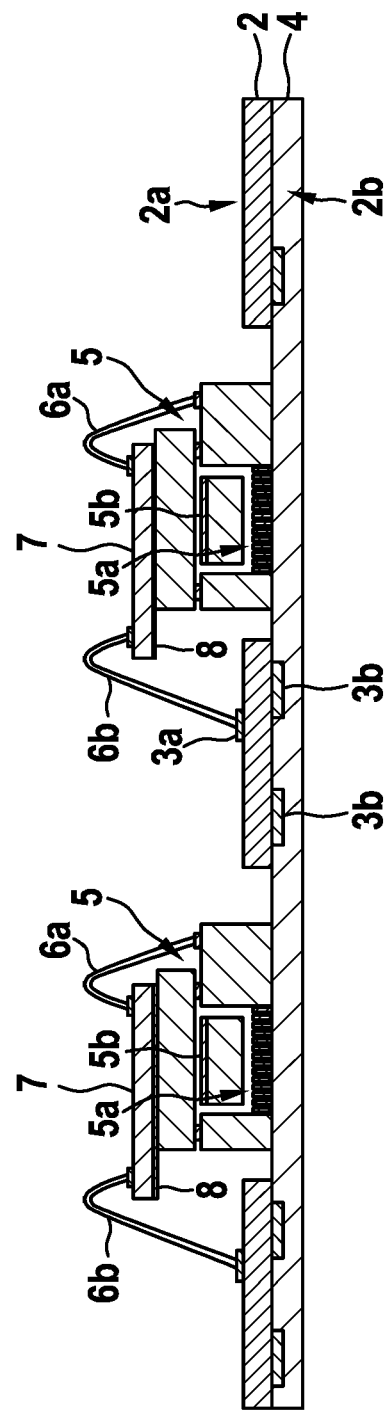
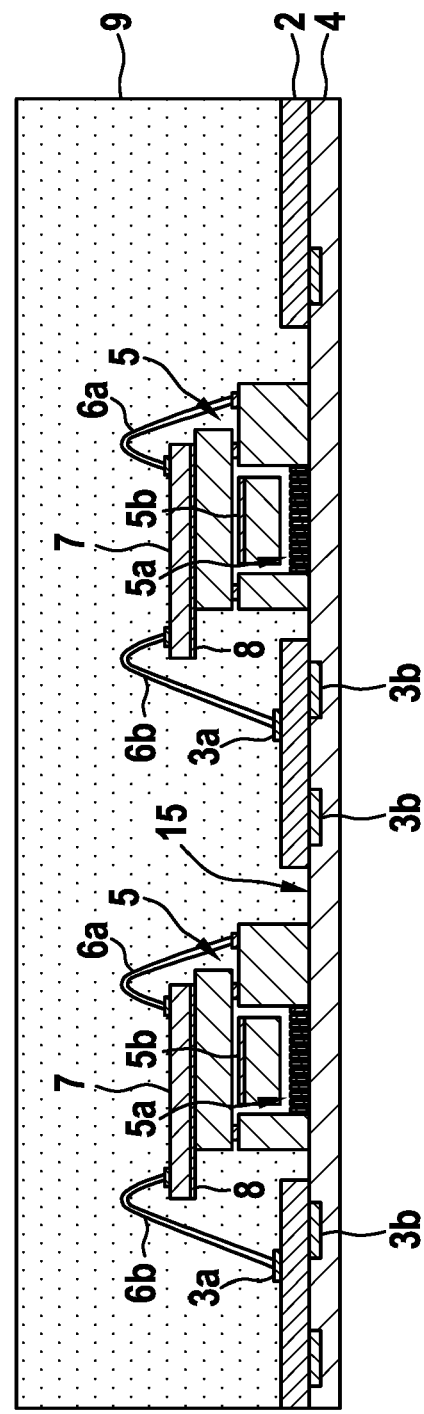

METHOD FOR MANUFACTURING A MEMS SENSOR

FIELD

The present invention relates to a method for manufacturing a MEMS sensor.

Moreover, the present invention relates to a MEMS sensor.

Although the present invention is applicable, in general, to arbitrary MEMS sensors, the present invention is described with respect to MEMS pressure sensors.

BACKGROUND INFORMATION

Conventional pressure sensors include a pressure-sensitive layer, for example, a diaphragm, which must remain in contact with the surroundings, in order to ensure a pressure access thereto. This pressure access is provided, in a conventional way, with the aid of so-called film-assisted molding and by, for example, a grid made up of small access holes on the top side of the chip of the pressure sensor. Due to the film-assisted molding, the chip usually protrudes from the molding compound and reduces the area of the remaining mold surface.

German Patent Application No. DE 10 2016 220 077 A1 describes a method for manufacturing a micromechanical pressure sensor, including the steps:
providing a MEMS wafer including a silicon substrate and a first cavity formed therein, under a sensor diaphragm;
providing a second wafer;
bonding the MEMS wafer with the second wafer; and
exposing a sensor core from the back side, a second cavity being formed between the sensor core and the surface of the silicon substrate, and the second cavity being formed with the aid of an etching process which is carried out with the aid of etching parameters changed in a defined manner.

SUMMARY

In one specific example embodiment, the present invention provides a method for manufacturing a MEMS sensor, including the steps
providing a substrate,
applying a support layer onto a back side of the substrate,
forming at least one cavity in the substrate in such a way that an access to the back side from the front side is formed,
introducing a MEMS structure into the at least one cavity, and
fixing the MEMS structure on the support layer.

In one further specific example embodiment, the present invention provides a MEMS sensor, manufactured with aid of the example method.

One of the advantages achieved therewith is that damage to access structures, for example, access holes, is therefore avoided. In addition, the mold surface is enlarged, since the MEMS sensor no longer protrudes from the molding compound. An improved handling is also provided, since damage to access structures during the molding is avoided. Cost- and manufacturing-intensive relief cavities in the mold tool are therefore also avoided.

Further features, advantages, and further specific embodiments of the present invention are described in the following or become apparent as a result.

According to one advantageous refinement of the present invention, the support layer is designed as a self-adhesive film layer, which is fixed at the substrate with the aid of adhesive bonding. This allows for a simple and cost-effective fixation of the support layer at the substrate.

According to one further advantageous refinement of the present invention, the MEMS structure is provided with an access structure for a functional layer, and the MEMS structure being situated in such a way that the access structure is closed after the fixation of the MEMS structure on the support layer. As a result, an access structure is directed essentially downward and it is protected and sealed by the support layer. Damage to the access structure and the functional layer of the MEMS structure is avoided as a result, in a simple and cost-effective way.

According to one further advantageous refinement of the present invention, after the fixation of the MEMS structure, an ASIC element is positioned, in particular with the aid of a die attach film and/or a liquid adhesive. Therefore, an ASIC element may be positioned in a simple way.

According to one further advantageous refinement of the present invention, the ASIC element is positioned on the MEMS structure. This allows for a compact arrangement of the MEMS structure and the ASIC element.

According to one further advantageous refinement of the present invention, an overmolding of the substrate and at least the MEMS structure takes place, in particular with the aid of transfer or compression molding. This allows for a simple and reliable protection of the MEMS sensor.

According to one further advantageous refinement of the present invention, contactings for the MEMS structure and/or for the ASIC element are situated on the front side of the substrate and the MEMS structure and/or the ASIC element are/is electrically contacted with the aid of wire bonding. This allows for a simple and cost-effective electrical contacting of the MEMS structure and/or the ASIC element.

According to one further advantageous refinement of the present invention, the support layer is removed after the overmolding. Therefore, the MEMS sensor may be easily placed into trays or as bulk material into containers, for example, for further processing.

According to one further advantageous refinement of the present invention, the support layer is acted upon by light in the UV range and/or thermally in order to be removed. The advantage thereof is that a simpler detachment of the support layer from the substrate is made possible.

According to one further advantageous refinement of the present invention, a plurality of cavities is formed, at least one MEMS structure being introduced into each of the cavities and, after the overmolding, a plurality of MEMS sensors being manufactured via separation according to the particular cavities, in particular with the aid of mechanical sawing in the direction from the front side toward the back side of the substrate. Therefore, a plurality of MEMS sensors may be manufactured in a simple and cost-effective way.

According to one further advantageous refinement of the present invention, at least one via is manufactured in the ASIC element, and the ASIC element and the MEMS structure are situated with respect to one another in such a way that the MEMS structure is electrically contacted with the aid of the at least one via of the ASIC element. This allows for a reliable contacting and a compact arrangement of the MEMS structure and the ASIC element.

Further features and advantages of the present invention result from the figures, and from the associated description of the figures.

It is understood that the features, which are mentioned above and which will be described in greater detail in the following, are usable not only in the particular combination indicated, but also in other combinations or alone, without departing from the scope of the present invention.

Preferred embodiments and specific embodiments of the present invention are represented in the figures and are explained in greater detail below, identical reference numerals relating to identical or similar or functionally identical components or elements.

BRIEF DESCRIPTION OF THE DRAWINGS

FIGS. 1-7 schematically show steps of a method according to one specific example embodiment of the present invention.

DETAILED DESCRIPTION OF EXAMPLE EMBODIMENTS

Figure 5:
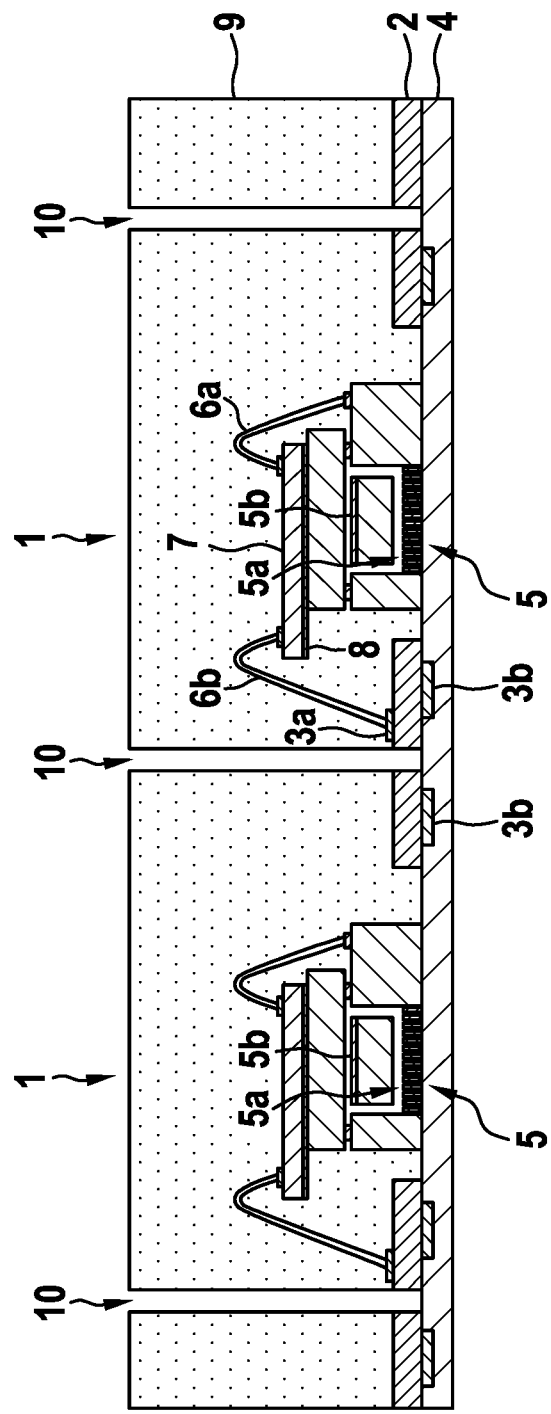

FIGS. 1 through 7 show steps of a method according to one specific example embodiment of the present invention.

FIGS. 1 through 7 show, in detail, steps of an example method for manufacturing a MEMS sensor 1. In FIG. 1, a substrate 2 is shown, which includes a temporarily situated carrier tape 4 on its back side 2b. Carrier tape 4, for example, in the form of a UV release tape, is laminated onto back side 2b of substrate 2. Carrier tape 4 includes, on the side facing substrate 2, an adhesive layer, which enables the adhesion between carrier tape 4 and substrate 2. Carrier tape 4 closes cavities 15 in substrate 2 from its back side 2b, as shown in FIG. 1. Substrate 2 also includes, on back side 2b, contactings 3b for the electrical contacting of substrate 2. These are completely enclosed by carrier tape 4.

In FIG. 2, MEMS structures 5 including accesses 5a for a functional layer 5b of particular MEMS structures 5 are now introduced into particular cavity 15. These may be introduced into cavities 15 of substrate 2 on carrier tape 4, for example, with the aid of a so-called die bonder or another suitable pick-and-place machine, and, there, adhesively bonded on carrier tape 4. The particular alignment of MEMS structure 5 for this process may take place with high accuracy via suitable reference points, so-called fiducials, which are applied onto substrate 2 during the manufacture (not represented in the figures). MEMS structures 5 for the MEMS sensor are oriented in such a way that accesses 5a are directed downward and are thereby temporarily closed by carrier tape 4. Moreover, bonding pads 3a are situated on front side 2a of substrate 2 for the subsequent electrical contacting of substrate 2. The exposure of bonding pads 3a may take place with the aid of a trench of the appropriate wafer applied from the back side. Due to the closure of accesses 5a by carrier tape 4, the entry of particles or water, for example, during sawing as described further below, may be avoided.

FIG. 3 shows an ASIC element 7 adhesively bonded with the aid of a film adhesive 8, also referred to as die attach film, DAF, onto MEMS structure 5. After the adhesive bonding, electrical connections 6a, 6b were also established for the electrical contacting of MEMS structure 5, ASIC element 7, and substrate 2, for example, with the aid of wire bonding. MEMS structure 5 and ASIC element 7 may be directly connected, as shown in FIG. 3. In one further specific embodiment, MEMS structure 5 and ASIC element 7 may also be electrically connected via a routing in substrate 2. In one further specific embodiment, ASIC element 7 may also be situated, in particular adhesively bonded, next to cavity 15 on substrate 2 or soldered onto substrate 2 as a flip stitch chip.

In FIG. 4, substrate 2 is shown having been overmolded with a molding compound 9 with the aid of transfer or compression molding. Accesses 5a, which are directed downward, are closed by carrier tape 4, so that no molding compound 9 may reach the underside and thereby enter accesses 5a. Since, during the molding process, the same pressure acts upon the top side of MEMS structure 5 and on the portion of carrier tape 4 not covered by MEMS structure 5, carrier tape 4 is deformed equally intensely both under as well as next to MEMS structure 5, and MEMS structure 5 is not pressed further into carrier tape 4. Therefore, a planar transition forms between the underside of MEMS structure 5 to be subsequently exposed and enclosing molding compound 9, i.e., a so-called undercut does not arise.

FIG. 5 shows a separation of particular MEMS sensors 1, in overmolded substrate 2, for example, by mechanical sawing from the sensor top side (saw cuts 10). The alignment for the sawing may take place via appropriate markings at the edge of substrate 2, which is not overmolded (not shown in the figures). Carrier tape 4 closes the back side of MEMS structure 5 and seals it. As a result, a contamination of MEMS structure 5 by particles or sawing water or the like penetrating accesses 5a is prevented.

Figure 6:
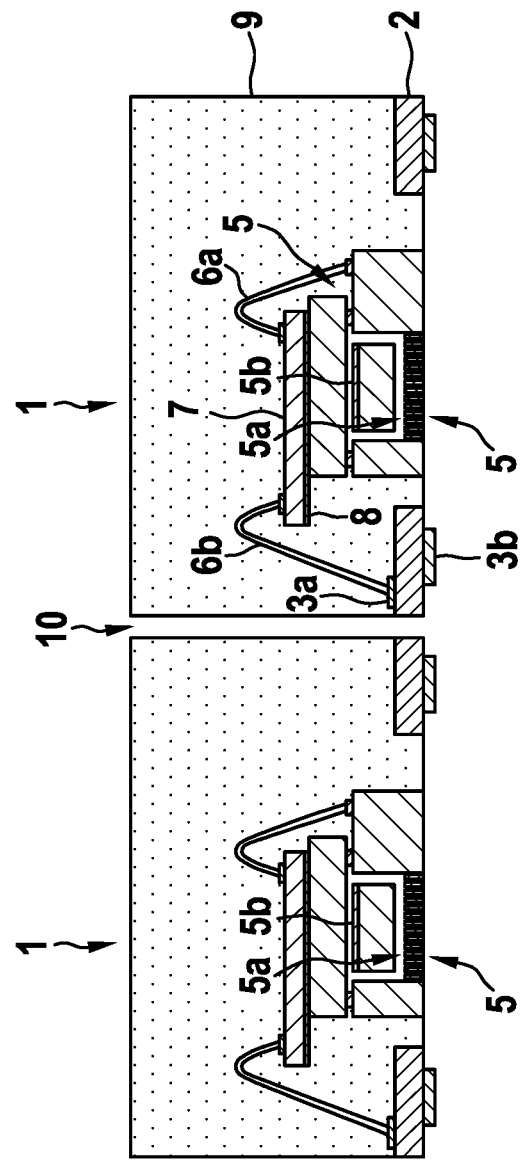

FIG. 6 now shows separated MEMS sensors 1 lifted off carrier tape 4, and these may therefore be placed, for example, into trays or as bulk material into containers for a further processing. The adhesion of carrier tape 4 may be reduced in advance, for example, by UV irradiation and/or thermal treatment, in order to allow for a residue-free detachment from back side 2b of substrate 2.

Figure 7:
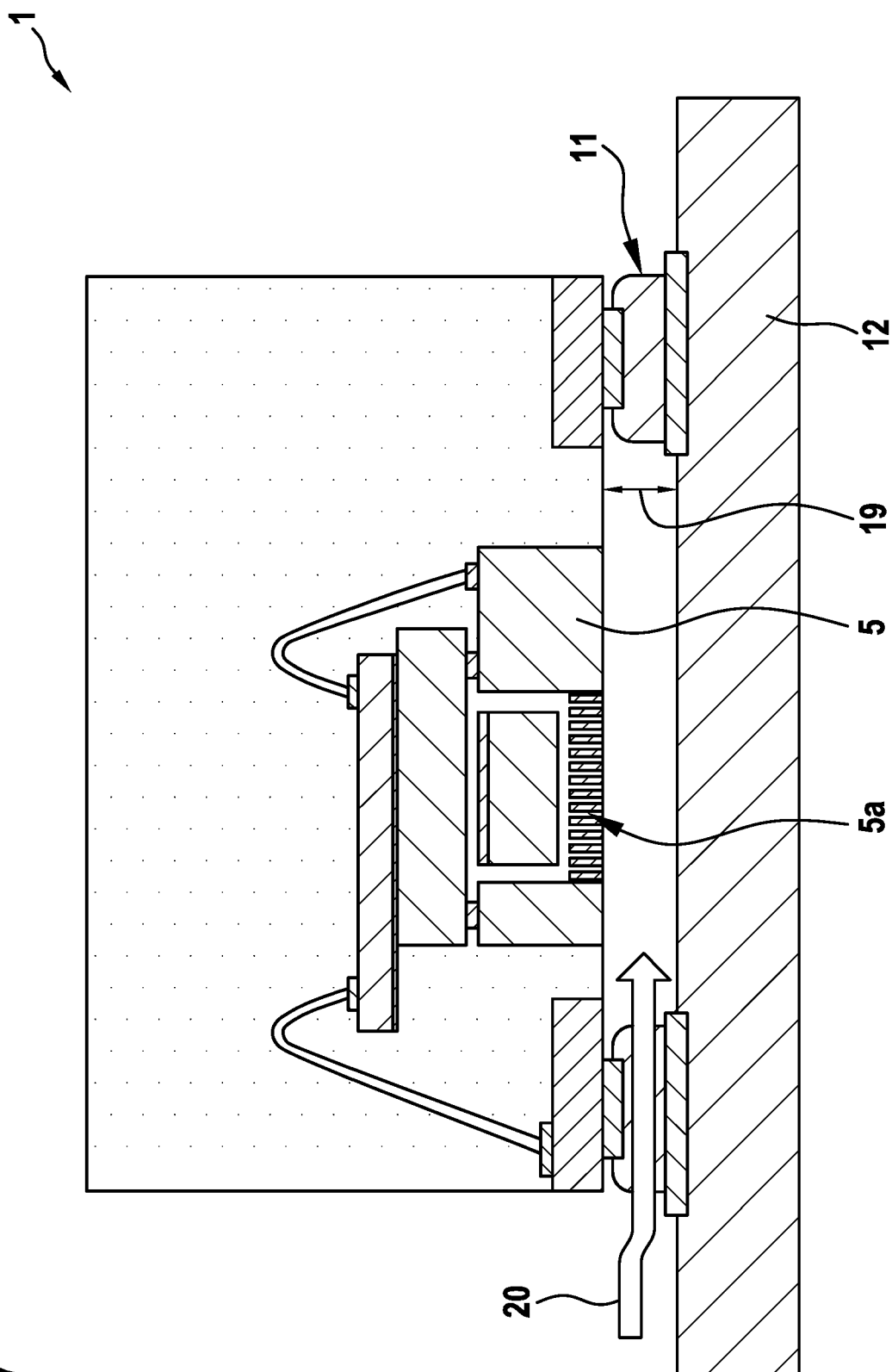

FIG. 7 now shows, by way of example, how a MEMS sensor may be utilized.

MEMS sensor 1 is soldered onto an application circuit board 12 with the aid of so-called reflow soldered joints 11. A small gap 19, having a gap height of approximately 20 µm to 50 µm, remains between the sensor underside and application circuit board 12, via which pressure access 20 takes place. Simultaneously, accesses 5a are protected mechanically as well as against the penetration of particles, however, via their alignment downward toward application circuit board 12 and by the small diameter of gap 19. In order to meet IP6x requirements, additionally, a hydrophobic coating may be already applied at wafer level, on the underside of MEMS structure 5 including accesses 5a. Since accesses 5a are protected by carrier tape 4 during all plasma steps in the package manufacture—the plasma treatment takes place before the wire bonding and before the molding—the hydrophobic effect of the hydrophobic coating applied at wafer level is maintained up to the final product.

Figure 8:
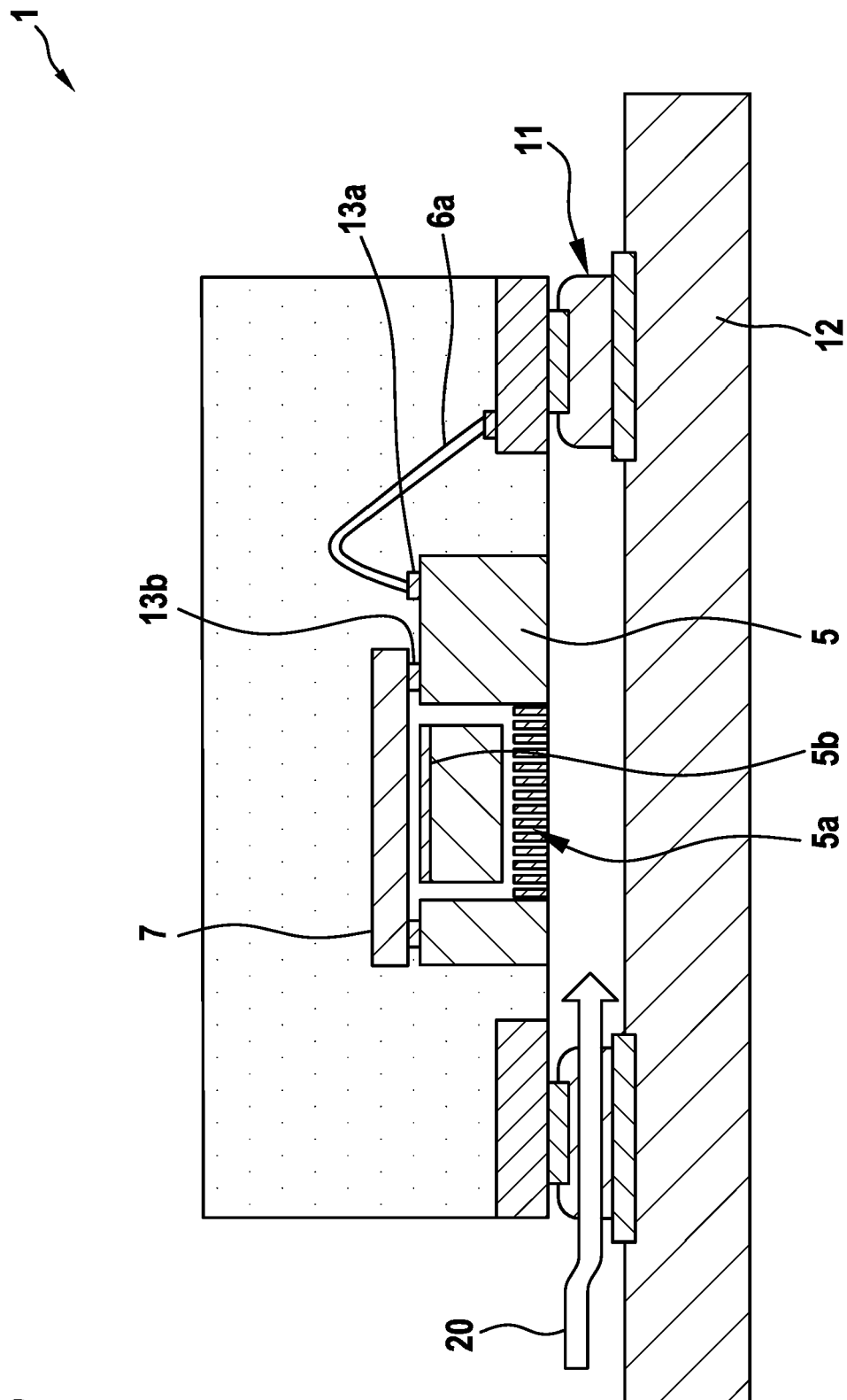
FIG. 8 schematically shows a MEMS sensor in cross section according to one specific example embodiment of the present invention.

FIG. 8 shows a MEMS sensor in cross section according to one specific embodiment of the present invention.

FIG. 8 generally shows, in detail, a MEMS sensor 1 according to FIG. 7. In contrast to MEMS sensor 1 according to FIG. 7, in the case of MEMS sensor 1 according to FIG. 8, ASIC element 7 is connected at wafer level by eutectic bond to MEMS structure 5. Eutectic bond 13b also allows for the electrical contacting of MEMS structure 5 and ASIC element 7. The contacting of MEMS structure 5 to substrate 2, via contacts 13a, then takes place via bonding wires 6a. The advantage thereof is that the overall height of MEMS sensor 1 and application circuit board 12 is extremely low. Alternatively, instead of the eutectic bond, other bonding processes are also possible, for example, a gold-gold bond.

Figure 9:
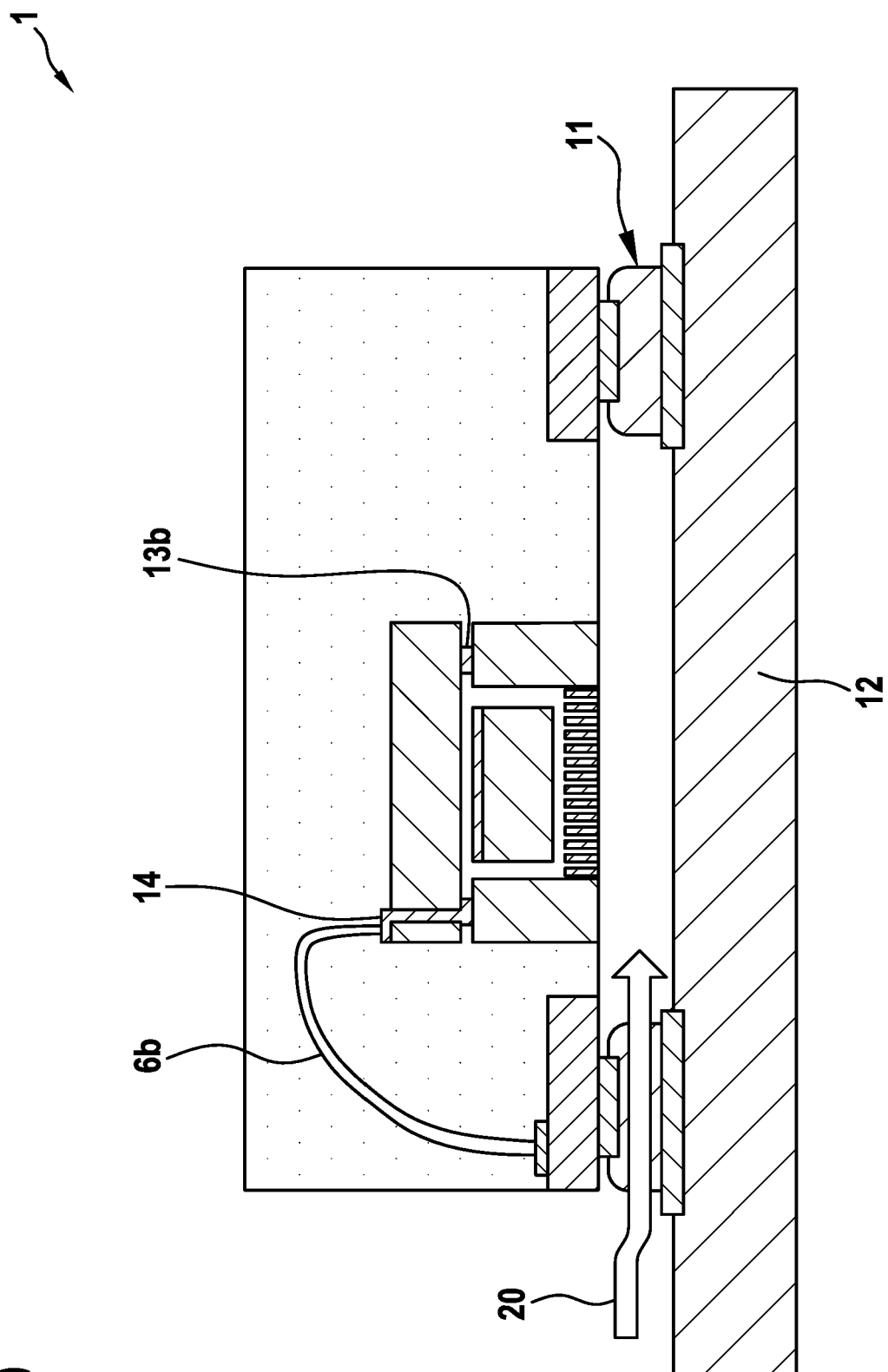
FIG. 9 schematically shows a MEMS sensor in cross section according to one specific example embodiment of the present invention.

FIG. 9 shows a MEMS sensor in cross section according to one specific embodiment of the present invention.

FIG. 9 essentially shows, in detail, a MEMS sensor 1 according to FIG. 8. In contrast to MEMS sensor 1 according to FIG. 8, in the case of MEMS sensor 1 according to FIG. 9, ASIC element 7 is now provided with a via 14, also referred to as a through-silicon via, or TSV. In this case, ASIC element 7 is directly electrically connected by wire bonding 6b to substrate 2.

During the manufacture of MEMS sensor 1 according to FIGS. 8 and 9, the step of adhesively bonding ASIC element 7 and its appropriate contacting as represented in FIG. 3 is dispensed with.

Figure 10:
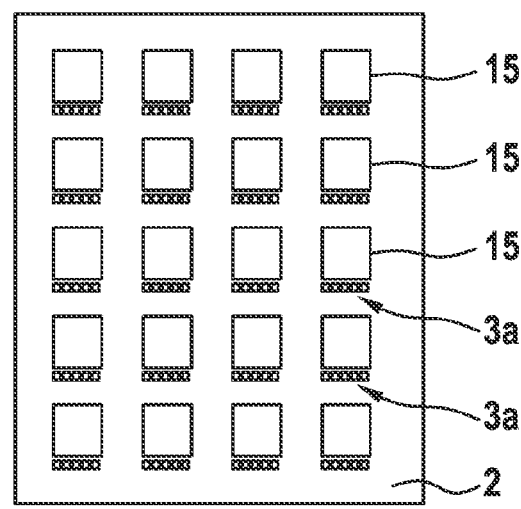
FIG. 10 schematically shows a MEMS sensor, in cross section, during a method according to one specific example embodiment of the present invention.

FIG. 10 shows a MEMS sensor, in cross section, during a method according to one specific example embodiment of the present invention.

In FIG. 10, substrate 2 is shown in the top view from above. Substrate 2 is provided with regularly situated, regularly shaped, in this case square, cavities 15. Appropriate bonding pads 3a for the subsequent electrical contacting are applied on the particular same side of cavities 15, at the bottom in each case in FIG. 10. After appropriate separation along the grid-shaped structure of substrate 2, which arose due to the creation of cavities 15, and after carrying out appropriate steps according to FIGS. 2 through 7, a plurality of MEMS sensors 1 may be manufactured. Substrate 2 may be implemented as an organic standard laminate substrate including a glass fiber core and copper lines. Cavities 15 may be manufactured, for example, by punching.

Figure 11:
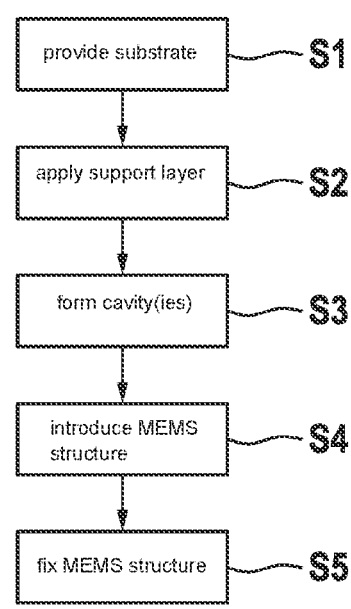
FIG. 11 schematically shows steps of a method according to one specific example embodiment of the present invention.

FIG. 11 shows steps of a method according to one specific example embodiment of the present invention.

In FIG. 11, steps of a method for manufacturing a MEMS sensor are shown.

A provision of a substrate takes place in a first step S1.

In one further step S2, an application of a support layer onto a back side of the substrate takes place.

In one further step S3, a formation of at least one cavity in the substrate takes place in such a way that an access to the back side from the front side is formed.

In one further step S4, an introduction of a MEMS structure into the at least one cavity takes place.

In one further step S5, a fixation of the MEMS structure on the support layer takes place.

In summary, at least one of the specific embodiments of the present invention has at least one of the following advantages:

Higher manufacturing tolerances.
Lower manufacturing costs.
Higher yield during the manufacture of multiple MEMS sensors.
Improved portability of the final product.
Improved protection against contaminants, in particular against particles and sawing water during the manufacturing process.
Improved handling of the MEMS sensor, in particular avoiding a breaking-off of edges, or the like.
Larger usable surface of the MEMS sensor.
Simplified handling for the end user.

Although the present invention was described herein on the basis of preferred exemplary embodiments, it is not limited thereto. Instead, the present invention is modifiable in various ways.

What is claimed is:

1. A method for manufacturing a MEMS sensor, comprising the following steps:
   providing a substrate;
   applying a support layer onto a back side of the substrate;
   forming at least one cavity in the substrate in such a way that an access to the back side from a front side of the substrate is formed;
   introducing a MEMS structure into the at least one cavity; and
   fixing the MEMS structure on the support layer.

2. The method as recited in claim 1, wherein the support layer is a self-adhesive film layer, which is fixed at the substrate using adhesive bonding.

3. The method as recited in claim 1, wherein the MEMS structure is provided with an access structure for a functional layer, and the MEMS structure is situated in such a way that the access structure is closed after the fixation of the MEMS structure on the support layer.

4. The method as recited in claim 1, wherein, after the fixation of the MEMS structure, an ASIC element is positioned, using a die attach film and/or a liquid adhesive.

5. The method as recited in claim 4, wherein the ASIC element is positioned on the MEMS structure.

6. The method as recited in claim 1, wherein an overmolding of the substrate and at least the MEMS structure takes place using transfer or compression molding.

7. The method as recited in claim 4, wherein contactings for the MEMS structure and/or for the ASIC element are situated on a front side of the substrate, and the MEMS structure and/or the ASIC element, is electrically contacted using wire bonding.

8. The method as recited in claim 6, wherein the support layer is removed after the overmolding.

9. The method as recited in claim 8, wherein the support layer is acted upon by light in a UV range and/or thermally in order to be removed.

10. The method as recited in claim 1, wherein a plurality of cavities is formed, at least one MEMS structure being introduced into each of the cavities and, after an overmolding, a plurality of MEMS sensors are manufactured through separation according to the cavities, using mechanical sawing in a direction from the front side toward the back side of the substrate.

11. The method as recited in claim 4, wherein at least one via is manufactured in the ASIC element, and the ASIC element and the MEMS structure are situated with respect to one another in such a way that the MEMS structure is electrically contacted using the at least one via of the ASIC element.

12. A MEMS sensor, comprising:
   a substrate; and
   a MEMS structure;
   the MEMS sensor being formed by applying a support layer onto a back side of the substrate, forming at least one cavity in the substrate in such a way that an access to the back side from a front side of the substrate is formed, introducing the MEMS structure into the at least one cavity, and fixing the MEMS structure on the support layer.

\* \* \* \* \*